US009768783B1

(12) United States Patent
Schmit et al.

(10) Patent No.: US 9,768,783 B1
(45) Date of Patent: Sep. 19, 2017

(54) METHODS FOR OPERATING CONFIGURABLE STORAGE AND PROCESSING BLOCKS AT DOUBLE AND SINGLE DATA RATES

(71) Applicant: Altera Corporation, San Jose, CA (US)

(72) Inventors: Herman Schmit, Palo Alto, CA (US); Jiefan Zhang, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/183,457

(22) Filed: Jun. 15, 2016

Related U.S. Application Data

(62) Division of application No. 14/045,658, filed on Oct. 3, 2013, now Pat. No. 9,385,724.

(51) Int. Cl.
| *H03K 19/177* | (2006.01) |
| *H03K 19/173* | (2006.01) |
| *G11C 7/22* | (2006.01) |
| *G11C 7/10* | (2006.01) |

(52) U.S. Cl.
CPC ........... *H03K 19/1737* (2013.01); *G11C 7/10* (2013.01); *G11C 7/22* (2013.01); *H03K 19/1776* (2013.01)

(58) Field of Classification Search
CPC ........ G11C 7/10; G11C 7/22; H03K 19/1737; H03K 19/1776
See application file for complete search history.

(56) References Cited

U.S. PATENT DOCUMENTS

| 4,117,541 | A | * | 9/1978 | Ali | .................. G06F 17/142 |
| | | | | | 333/18 |
| 4,157,457 | A | * | 6/1979 | Sakoe | .................. G10L 19/00 |
| | | | | | 702/76 |
| 5,367,476 | A | * | 11/1994 | Elliott | .................. H03H 17/0225 |
| | | | | | 708/301 |
| 5,757,867 | A | | 5/1998 | Caulfield et al. | |
| 6,041,339 | A | * | 3/2000 | Yu | .................. H03H 17/0664 |
| | | | | | 708/313 |
| 6,151,271 | A | * | 11/2000 | Lee | .................. G11C 7/1006 |
| | | | | | 365/194 |

(Continued)

FOREIGN PATENT DOCUMENTS

| WO | 03028277 | 4/2003 |
| WO | 2011153107 | 12/2011 |

*Primary Examiner* — Alexander H Taningco
*Assistant Examiner* — Kurtis R Bahr

(57) ABSTRACT

Integrated circuits such as application specific circuits or programmable logic devices may include specialized blocks such as configurable storage blocks and configurable processing blocks. Such specialized blocks may be controlled by clock signals and operated at single data rate or at double data rate. For instance, configurable storage blocks may be configured to use a double data rate communications scheme or a single data rate communication scheme to communicate data with other blocks. Configurable processing blocks may be configured to process data at a double data rate or a single data rate. Furthermore, configurable processing blocks that include accumulator circuitry may be configured to perform one accumulation at a single data rate or at a double data rate. Such configurable processing blocks may also be configured to perform two accumulations at a single data rate.

17 Claims, 15 Drawing Sheets

(56) References Cited

U.S. PATENT DOCUMENTS

| | | | |
|---|---|---|---|
| 6,198,035 B1 * | 3/2001 | Saito | G10H 1/186 |
| | | | 84/600 |
| 6,510,445 B2 * | 1/2003 | Takano | H03H 17/0294 |
| | | | 708/316 |
| 6,686,769 B1 | 2/2004 | Nguyen et al. | |
| 6,725,325 B2 | 4/2004 | Nishiyama et al. | |
| 6,735,420 B2 * | 5/2004 | Baldwin | H04W 52/267 |
| | | | 455/115.1 |
| 6,751,217 B1 | 6/2004 | Brown et al. | |
| 6,930,509 B2 * | 8/2005 | Banik | H03K 19/17744 |
| | | | 326/38 |
| 7,103,793 B2 | 9/2006 | Rentschler et al. | |
| 7,190,754 B1 | 3/2007 | Chang et al. | |
| 7,366,747 B2 * | 4/2008 | Matoba | H03H 17/02 |
| | | | 708/300 |
| 7,460,431 B1 | 12/2008 | Pan et al. | |
| 7,631,211 B1 | 12/2009 | Mai | |
| 7,661,010 B2 | 2/2010 | DeFazio et al. | |
| 7,751,275 B2 | 7/2010 | Gronlund | |
| 7,928,770 B1 * | 4/2011 | Bellis | G11C 7/1051 |
| | | | 326/38 |
| 8,649,210 B2 | 2/2014 | Lin et al. | |
| 8,743,634 B2 | 6/2014 | Magee et al. | |
| 8,831,140 B2 | 9/2014 | Chan et al. | |
| 2003/0177157 A1 * | 9/2003 | Matoba | H03H 17/06 |
| | | | 708/316 |
| 2004/0263363 A1 | 12/2004 | Biswas | |
| 2005/0228929 A1 | 10/2005 | Penton et al. | |
| 2010/0150281 A1 * | 6/2010 | Lee | H04L 25/03006 |
| | | | 375/341 |

* cited by examiner

METHODS FOR OPERATING CONFIGURABLE STORAGE AND PROCESSING BLOCKS AT DOUBLE AND SINGLE DATA RATES

This application is a division of U.S. patent application Ser. No. 14/045,658, filed Oct. 3, 2013, which is hereby incorporated by reference herein in its entirety. This application claims the benefit of and claims priority to U.S. patent application Ser. No. 14/045,658, filed Oct. 3, 2013.

BACKGROUND

This invention relates to integrated circuits such as integrated circuits with configurable storage blocks, configurable processing blocks, and configurable interconnect circuitry.

Considering a programmable logic device (PLD) as one example of an integrated circuit, as applications for which PLDs are used increase in complexity, it has become more common to design PLDs to include specialized blocks such as configurable storage blocks and configurable processing blocks in addition to blocks of generic programmable logic. Such specialized blocks may include circuitry that has been partly or fully hardwired to perform one or more specific tasks, such as a logical or a mathematical operation. A specialized block may also contain one or more specialized structures. Examples of structures that are commonly implemented in such specialized blocks include multipliers, arithmetic logic units (ALUs), memory elements such as random-access memory (RAM) blocks, read-only memory (ROM) blocks, content-addressable memory (CAM) blocks and register files, AND/NAND/OR/NOR arrays, etc., or combinations thereof.

SUMMARY

In accordance with some embodiments described herein, an integrated circuit may include first and second specialized blocks and configurable interconnect circuitry. The configurable interconnect circuitry is coupled between an output of the first specialized block and an input of the second specialized block, and each of the first and second specialized blocks is controlled by a clock signal. The first specialized block may produce first and second signals during a first clock period of the clock signal. The first and second signals may be sent from the output of the first specialized block over the configurable interconnect circuitry to the input of the second specialized block. The second specialized block may receive the first and second signals at the input during a second clock period of the clock signal.

The second specialized block may include first and second registers. The first signal may be stored in the first register and the second signal in the second register.

The embodiments described herein can be implemented in numerous ways, such as a process, an apparatus, a system, a device, or a method executed on a processing machine. Examples of such implementations are provided with reference to several embodiments described below.

In certain embodiments, the first signal may be stored in the first register of the second specialized block at a rising edge of the clock signal, and the second signal may be stored in the second register of the second specialized block at a falling edge of the clock signal.

In alternative embodiments, the second specialized block may further include a multiplexer coupled to the first and second registers. The multiplexer may receive the stored first signal from the first register and the stored second signal from the second register and select between the stored first signal and the stored second signal based on the clock signal.

Further features of the invention, its nature and various advantages, will be more apparent from the accompanying drawings and the following detailed description of the embodiments.

DETAILED DESCRIPTION

The present invention relates to integrated circuits such as integrated circuits with configurable storage blocks, configurable processing blocks, and configurable interconnect circuitry.

Considering a programmable logic device (PLD) as one example of an integrated circuit. Modern PLDs include more and more different types of specialized blocks such as configurable storage blocks and configurable processing blocks. Such specialized blocks may include circuitry that has been partly or fully hardwired to perform one or more specific tasks.

Programmable logic devices (PLDs) often operate using clock signals that operate at given clock frequencies. The maximum clock frequency at which a user design implemented in a PLD can operate is the minimum of the clock frequencies at which each of the components of the user design can operate. Specialized blocks are usually designed to operate at higher clock frequencies than the blocks of generic programmable logic. Therefore, components of a user design implemented in specialized blocks are often able to operate at much higher clock frequencies than the rest of a user design. However, their actual clock frequencies are much lower, thereby leaving some of the built-in performance of the specialized blocks unexploited.

It would therefore be desirable to use specialized blocks more efficiently. Consider the scenario where specialized blocks have configurations that enable those specialized blocks to operate at double data rates. In such a scenario, specialized blocks may process a first portion of data during a first phase of a clock cycle and a second portion of data during a second phase of the same clock cycle, thereby reducing the number of required specialized blocks. A reduction in the number of required specialized blocks would reduce the size and thus the implementation cost for a design that uses specialized blocks.

It will be recognized by one skilled in the art, that the present exemplary embodiments may be practiced without some or all of these specific details. In other instances, well-known operations have not been described in detail in order not to unnecessarily obscure the present embodiments.

Figure 1A:
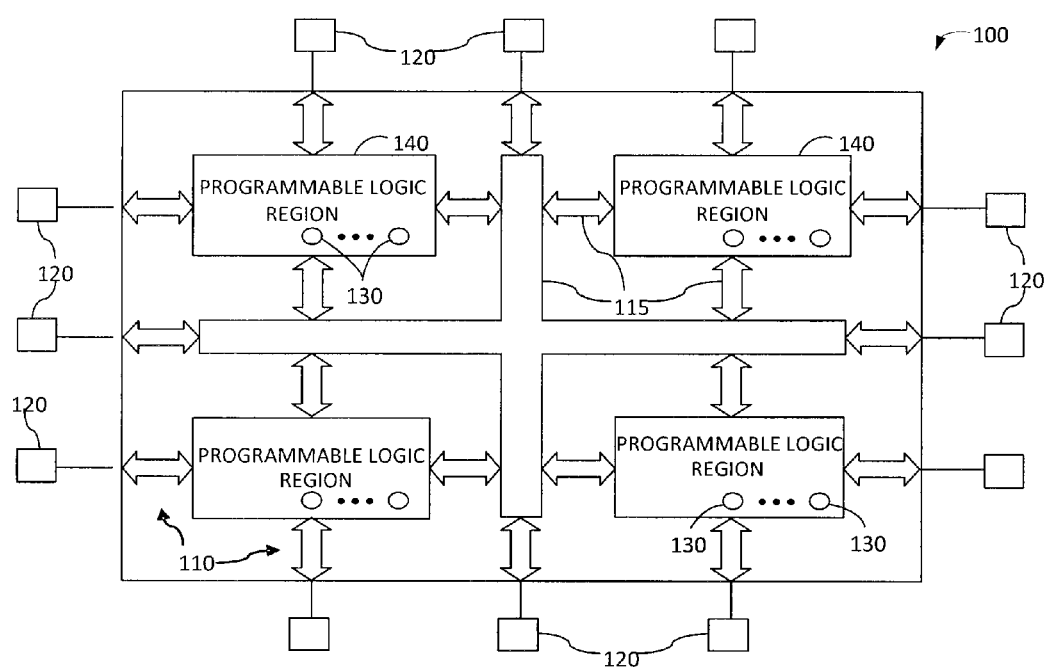
FIG. 1A is an diagram of an illustrative integrated circuit with programmable logic regions in accordance with an embodiment of the present invention.

An illustrative embodiment of an integrated circuit such as a programmable logic device 100 in accordance with the present invention is shown in FIG. 1A.

Programmable logic device (PLD) 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 include conventional input/output circuitry, serial data transceiver circuitry, differential receiver and transmitter circuitry, or other circuitry used to couple one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry. The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability.

The programmable components and the specialized blocks in programmable logic region 140 may be configurable to operate at single data rate (e.g., synchronized to a rising clock edge) or at double data rate (e.g., synchronized to a rising and a falling clock edge).

The programmable interconnects 115 may also be considered to be a type of programmable logic region 140.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM, or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs— sometimes referred to as adaptive logic elements or ALEs in this context). The larger regions may be, for example, logic array blocks (LABs) containing multiple logic elements or multiple ALMs.

During device programming, configuration data is loaded into device 100 that configures the programmable logic regions 140 so that their logic resources perform desired logic functions.

Figure 1B:
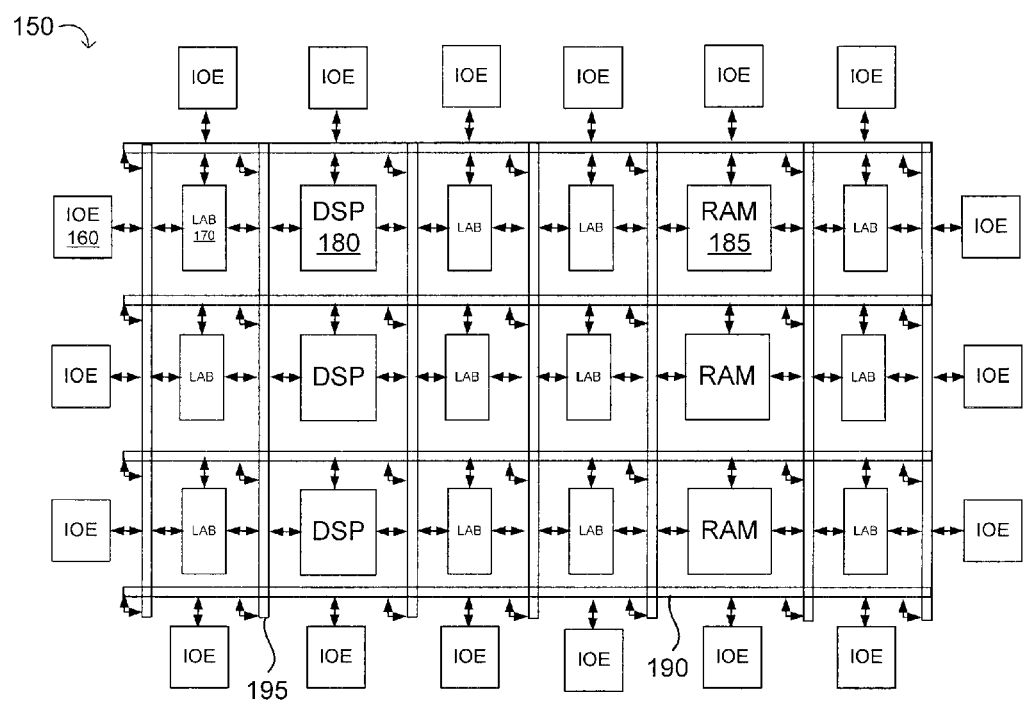
FIG. 1B is a diagram of an illustrative integrated circuit with specialized blocks in accordance with an embodiment of the present invention.

An illustrative embodiment of an programmable logic device (PLD) 150 having specialized blocks is shown in FIG. 1B. As shown, the programmable logic device (PLD) may include a two-dimensional array of blocks, including logic array blocks (LABs) 170 and other specialized blocks, such as random access memory (RAM) blocks 185 and digital signal processing (DSP) blocks 180, for example. If desired, the blocks of such an integrated circuit may be arranged in more levels or layers in which multiple blocks are interconnected to form still larger blocks. Other device arrangements may use blocks that are not arranged in rows and columns.

PLD 150 may include programmable interconnect in the form of vertical routing channels 195 and horizontal routing channels 190, each routing channel including one or more routing wires. If desired, PLD 150 may include diagonal routing channels or vertical routing channels in the case of three-dimensional circuits. PLD 150 may have input/output elements (IOEs) 160. These input/output elements (IOEs) 160 may be located around the periphery of the chip. If desired, input/output elements may be located anywhere on the integrated circuit. For example, PLD 150 may have a column of input/output elements 160 located between specialized blocks.

Figure 2A:
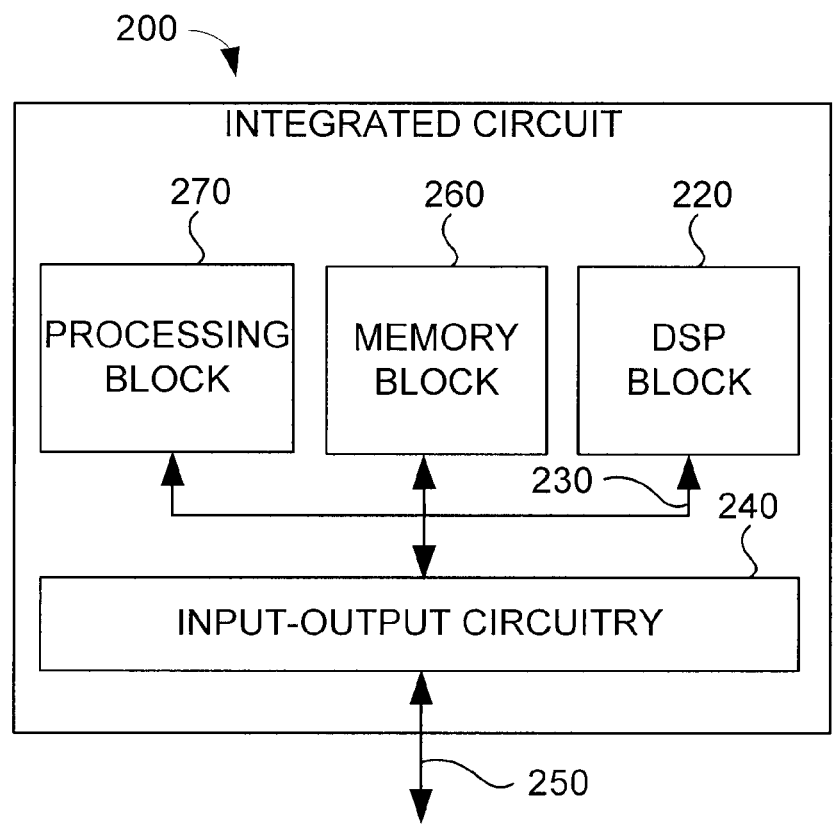
FIG. 2A is a diagram of an illustrative integrated circuit with storage, processing, and input-output circuitry in accordance with an embodiment of the present invention.

FIG. 2A is a block diagram of an integrated circuit 210 in accordance with the present invention is shown in. Integrated circuit 200 may include a memory block 260, a digital signal processing (DSP) block 220, a processing block 270, and input/output circuitry 240. DSP block 220 may include multipliers, adders, accumulators, shifters, and other arithmetic circuitry. DSP block 220 may also include storage elements such as registers, latches, memory arrays, or other storage circuitry. Such storage elements may serve different purposes. For instance, storage elements may store coefficients for implementing FIR filters. Alternatively, storage elements may be used to pipeline a critical path or to synchronize data before it is processed.

Memory block 260 may include random-access memory (RAM), first-in first-out (FIFO) circuitry, stack or last-in first-out (LIFO) circuitry, read-only memory (ROM), registers, latches, or other storage circuitry suitable to store data. Input/output circuitry may include parallel input/output circuitry, differential input/output circuitry, serial data transceiver circuitry, or other input/output circuitry suitable to transmit and receive data.

Processing block 270 may include embedded microprocessors, microcontrollers, or other processing circuitry. Processing block 270 may have combinational and sequential logic circuitry such as logical function blocks and storage elements such as registers. Processing block 270 may be configurable or programmable.

Internal interconnection resources 230 such as conductive lines and busses may be used to send data from one component to another component or to broadcast data from one component to one or more other components. External interconnection resources 250 such as conductive lines and busses, optical interconnect infrastructure, or wired and wireless networks with optional intermediate switches may be used to communicate with other devices. In certain embodiments, the internal interconnect resources 230, and/or the external interconnect resources 250 may be implemented using configurable interconnect circuitry.

Memory block 260, DSP block 220, and processing block 270 may be controlled by a clock signal. Processing block 270 may operate at single data rate. Memory block 260 and DSP block 220 may be configurable to operate at single data rate or at double data rate. For example, processing block 270 may be controlled by either the rising edge or the falling edge of the clock signal (i.e., at single data rate). Memory block 260 and DSP block 220 may also be configured to be controlled by either the rising edge or the falling edge of the clock signal (i.e., at single data rate). Alternatively, memory block 260 and DSP block 220 may be configured to be controlled by both, the rising edge and the falling edge of the clock signal (i.e., at double data rate).

Figure 2B:
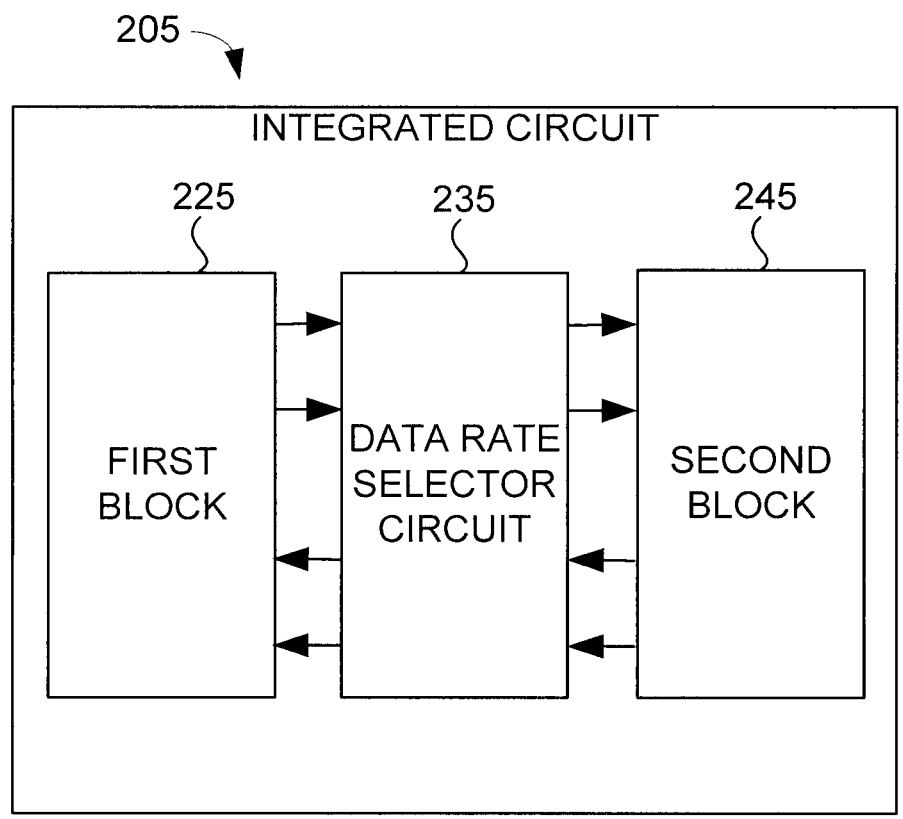
FIG. 2B is a diagram of an illustrative integrated circuit with first and second blocks coupled by a data rate selector circuit in accordance with an embodiment of the present invention.

Some blocks on an integrated circuit may operate at double data rate and other blocks may operate at single data rates. Blocks that operate at double data rate may be referred to as "fast" blocks, and blocks that operate at single data rate may be referred to as "slow" blocks. FIG. 2B shows an embodiment of an integrated circuit 205 that includes a first block 225 that operates at single data rate and a second block 245 that operates at double data rate.

First block 225 and second block 245 may communicate with each other through data rate selector circuit 235. First block 225 may send two sets of data at single data rate to data rate selector circuit 235. Data rate selector circuit 235 may aggregate the two sets of data and send the aggregated signal at double data rate to second block 245. For example, data rate selector circuit 235 may select the first data set at a rising edge of a clock signal and the second data set at a falling edge of the clock signal. For example, data rate selector circuit 235 may sample the first data set with registers that are triggered by a rising edge of the clock signal and the second data set with registers that are triggered by a falling edge of the clock signal. Additional selector circuitry may select one of the data sets stored in the registers every other clock edge and send the selected data set to second block 245 thereby aggregating the two data sets.

Second block 245 may send a single set of data to data rate selector circuit 235 at a double data rate. Data rate selector circuit 235 may separate the data set into two data sets each having a single data rate and send the two data sets to first block 225. For example, data rate selector circuit 235 may receive the data set with registers that are triggered by a falling edge of a clock signal and registers that are triggered by a rising edge of the clock signal. Data rate selector circuit 235 may provide the outputs of these registers separately to first block 225.

Figure 2C:
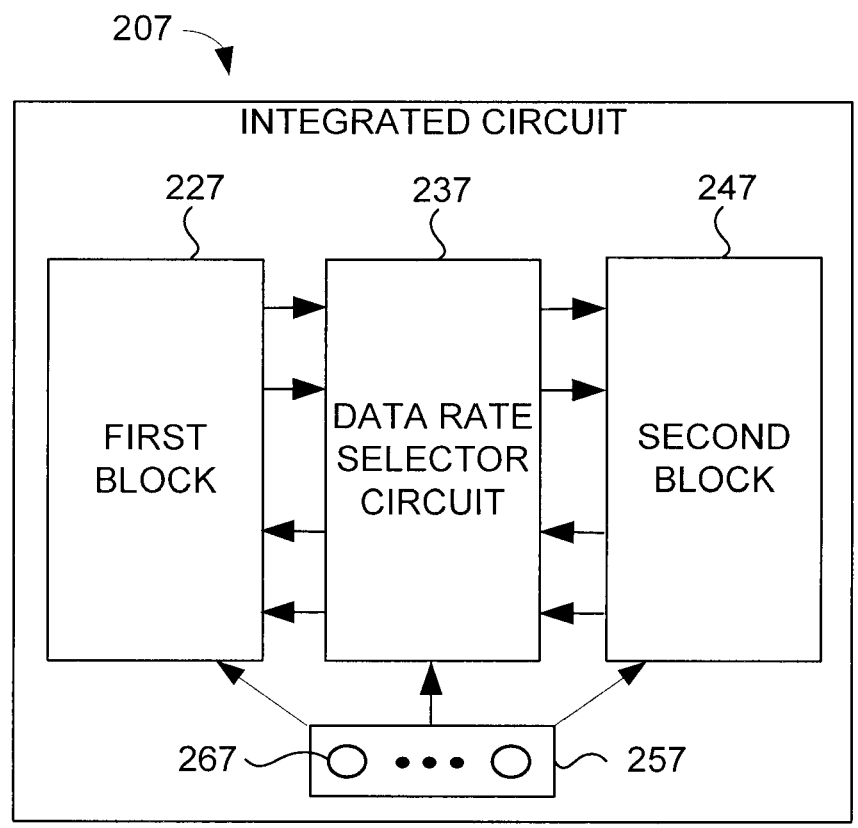
FIG. 2C is a diagram of an illustrative integrated circuit with a configurable data rate selector circuit coupled between first and second blocks that are configurable to operate at single or double data rate in accordance with an embodiment of the present invention.

Some blocks on an integrated circuit may operate at either double data rate or single data rate based on a current configuration of the blocks. FIG. 2C shows an embodiment of an integrated circuit 207 that may include a first block 227, a second block 247, data rate selector circuit 237, and configuration memory 257. Memory elements 267 in configuration memory 257 may configure first block 227 and second block 247 to operate at either double data rate or single data rate. Memory elements 267 may also configure data rate selector circuit 237 to interface between blocks that operate at single or double data rate.

For example, memory elements 267 in configuration memory 257 may configure first block 227 to operate at single data rate and second block 247 to operate at double data rate. In this example, first block 227 may send two sets of data at single data rate to data rate selector circuit 237.

Memory elements 267 may configure data rate selector circuit 237 to aggregate the two sets of data and send the aggregated signal at double data rate to second block 247. As another example, memory elements 267 may configure data rate selector circuit 237 to select the first data set at a rising edge of a clock signal and the second data set at a falling edge of the clock signal. For example, memory elements 267 may configure data rate selector circuit 237 to sample the first data set with registers that are triggered by a rising edge of the clock signal and the second data set with registers that are triggered by a falling edge of the clock signal. Memory elements 267 may configure additional selector circuitry to select one of the data sets stored in the registers every other clock edge and to send the selected data set to second block 247 thereby aggregating the two data sets.

Second block 247 may send a single set of data to data rate selector circuit 237 at a double data rate. Memory elements 267 may configure data rate selector circuit 237 to separate the data set into two data sets each having a single data rate and to send the two data sets to first block 227. For example, memory elements 267 may configure data rate selector circuit 237 to receive the data set with registers that are triggered by a falling edge of a clock signal and registers that are triggered by a rising edge of the clock signal. Data rate selector circuit 235 may provide the outputs of these registers separately to first block 225.

If desired, first block 227 may be configured to operate at single data rate and send a single set of data at single data rate through data rate selector circuit 237 to second block 247. Second block 247 may also be configured to operate at single data rate and receive and process the single set of data at single data rate.

Alternatively, first block 227 may be configured to operate at double data rate and send a single set of data at double data rate through data rate selector circuit 237 to second block 247. Second block 247 may also be configured to operate at double data rate and receive and process the single set of data at double data rate.

Figure 2D:
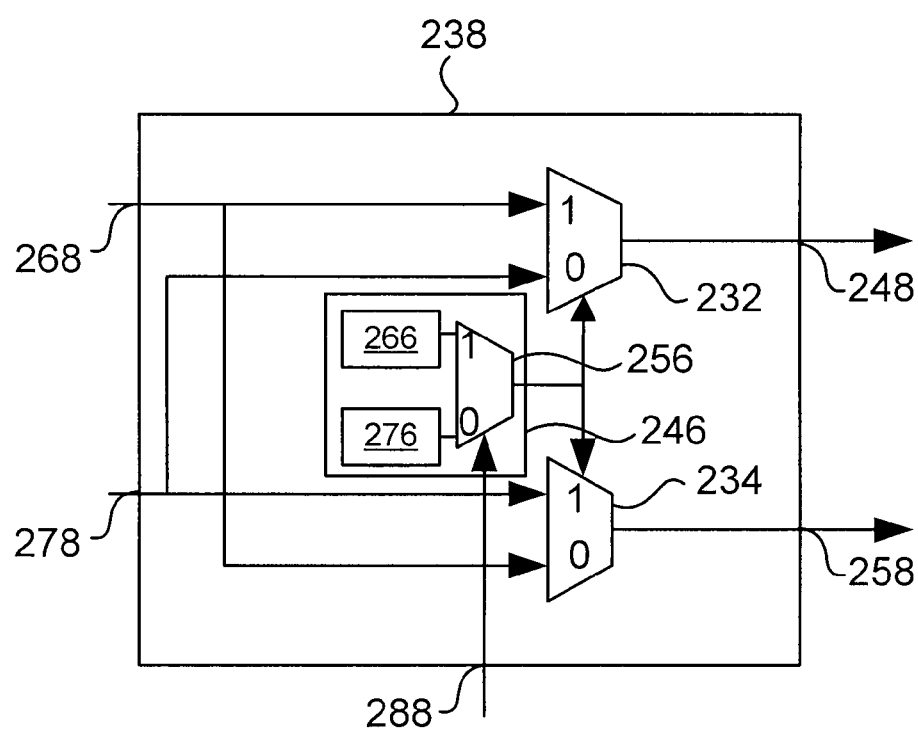
FIG. 2D is a diagram of an illustrative data rate selector circuit in accordance with an embodiment of the present invention.

FIG. 2D shows an embodiment of a data rate selector circuit 238. Data rate selector circuit 238 may receive signals at single or double data rate at inputs 268 and 278 and provide these signals at single or double data rate at outputs 248 and 258 based on the configuration of edge selector circuit 246.

As shown, edge selector circuit 246 may include configuration memory 266 and 276 and multiplexer 256. Multiplexer 256 may select between signals received from configuration memory 266 and 276 based on a clock signal received at input 288. When the clock signal is logic "1", multiplexer 256 may select the signal received from configuration memory 266 and when the clock signal is logic "0", multiplexer 256 may select the signal received from configuration memory 276.

As an example, configuration memory 266 and 276 may both be configured to be logic "1". In this example, multiplexer 232 may select the signal received at input 268, which is then provided at output 248. Similarly, multiplexer 234 may select the signal received at input 278, which is then provided at output 258. Thus, a double data rate signal received at input 268 is provided as a double data rate signal at output 248, and a double data rate signal received at input 278 is provided as a double data rate signal at output 258. Similarly, single data rate signals received at inputs 268 and 278 are provided as single data rate signals at outputs 248 and 258, respectively.

As another example, consider the scenario in which configuration memory 266 is configured to be logic "1" and configuration memory 276 is configured to be logic "0". In this scenario, multiplexer 256 may provide a logic "1" when the clock signal is logic "1" and a logic "0" when the clock signal is logic "0". Thus, multiplexers 232 and 234 may provide the signals received at inputs 268 and 278, respectively when the clock signal is logic "1" and the signals received at inputs 278 and 268, respectively, when the clock signal is logic "0". For example, a double data rate signal received at input 268 may be provided as two single data rate signals at outputs 248 and 258. As another example, two single data rate signals received at inputs 268 and 278 may be provided as one double data rate signal at output 248 or 258, provided that one of the single data rate signals is synchronous to the falling edge of the clock signal.

Figure 3:
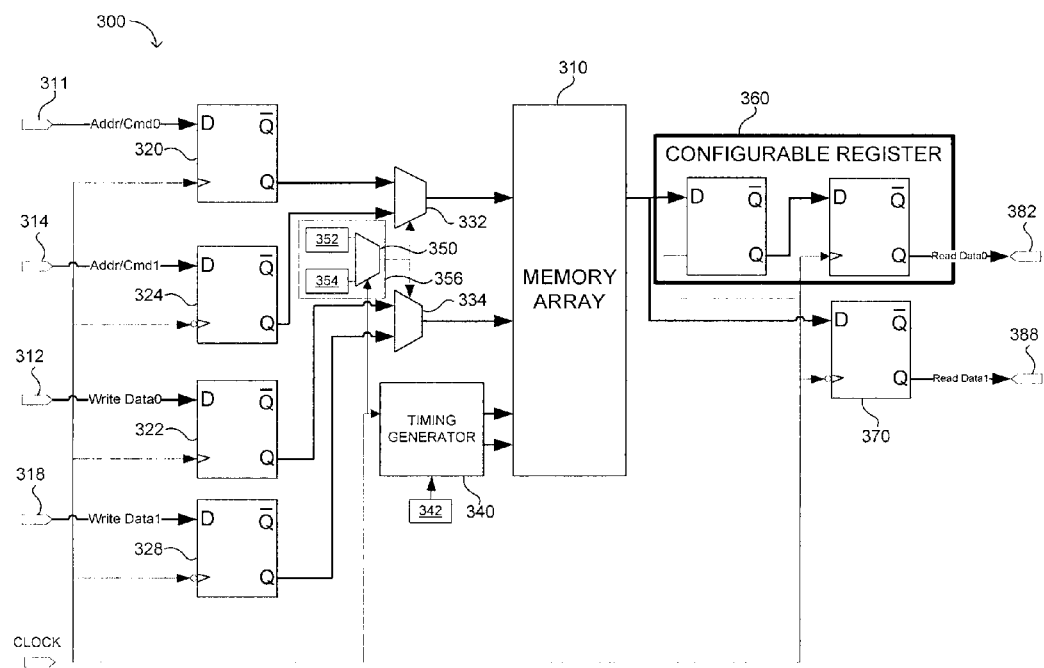
FIG. 3 is a diagram of an illustrative configurable storage circuit that may be operated at single or double data rate in accordance with an embodiment of the present invention.

FIG. 3 illustrates a memory block 300 that may be configured to operate at single data rate or double data rate in accordance with one embodiment. Memory block 300 may include two address ports 311 and 314, two write ports 312 and 318, two read ports 382 and 388, and a clock port for receiving address signals, data signals, and clock signals from other blocks, respectively. In alternative embodiments, memory block 300 may have more or less than two read and write ports, and each read and write port may have an arbitrary bit-width enabling the respective port to receive a given number of signals simultaneously. In other embodiments, memory block 300 may further be controlled by more than one clock signal. For example, each port may be controlled by a different clock signal. Alternatively, each given subset of the ports may be controlled by a different clock signal. Memory block 300 may also have ports to receive additional control signals such as clock enable signals, read enable signals, write enable signals, reset signals, etc. Memory block 300 may also generate additional output signals for example signals allowing for error detection and correction such as error correcting codes (ECC), parity bits, cyclic redundancy check (CRC) signatures, to name a few.

Memory array 310 may have random-access memory (RAM), read-only memory (ROM), or other addressable memory elements. Memory array 310 may be organized in a one-dimensional array of memory elements. Alternatively, memory elements of memory array 310 may be organized in an array of more than one dimension. If desired, memory elements that constitute the memory array may be arranged in rows and columns. Memory array 310 may include row and column control circuitry. Row and column control circuitry may include row addressing circuitry, column multiplexing circuitry, write driver circuitry, read sensing circuitry, data register circuitry, etc.

Memory block 300 may have two address ports for receiving address signals and two write ports for receiving data signals, where each write data port is associated with one of address ports. The address ports may be coupled to address registers 320 and 324 and the data ports may be coupled to data registers 322 and 328. All registers 320, 322, 324, and 328 may be controlled by the clock signal. Registers 320 and 322 may be rising edge triggered registers, whereas registers 324 and 328 may be falling edge triggered registers. In other words, registers 320 and 322 latch the signals received by the address and data inputs at rising edges of the clock signal while registers 324 and 328 latch the signals received by the address and data inputs at falling edges of the clock signal.

Memory block 300 may include multiplexers 332, 334, and 350. Multiplexer 332 may select between the address signal stored in rising edge triggered address register 320 and the address signal stored in falling edge triggered address register 324. Multiplexer 334 may select between the data signal stored in rising edge triggered data register 322 and the data signal stored in falling edge triggered data register 328. Multiplexers 332 and 334 may select which of the respective inputs to propagate based on the clock signal received at the clock input (not shown).

Alternatively, multiplexers 332 and 334 may select which of the respective inputs to propagate based on the output of edge selector circuitry 356. Edge selector circuitry 356 may include two configuration memory elements 352 and 354. Multiplexer 350 may receive two constant signals from configuration memory elements 352 and 354. These memory elements may be configured to store a predetermined value. Typically, this is done once at initialization. However, in alternative embodiments, memory elements 352 and 354 may also be reconfigured while the memory block 300 is operating. The clock signal received at the clock input selects which constant signal is propagated to the output of multiplexer 350. The output of multiplexer 350 carries the signal from one memory element (e.g., memory element 352) while the clock signal is logic "1" and switches to carry the signal from the other memory element (e.g., memory element 354) while the clock signal is logic "0."

For example, when both memory elements 352 and 354 are configured with opposite value (e.g., the first memory element is configured to be logic "0" and the second memory element is configured to be logic "1"). In this scenario, the signal on the output of multiplexer 350 and thus the signal on the output of edge selector circuit 356 may change polarity every time the polarity of the clock signal changes. A select signal received by multiplexers 332 and 334 that changes polarity every time the polarity of the clock signal changes has the effect that multiplexers 332 and 334 always select a different input for propagation to memory array 310 based on the polarity of the clock signal (e.g., the signals coming from rising edge triggered registers 320 and 322 may be propagated to memory array 310 when the polarity of the clock signal is 1, and the signals coming from falling edge triggered registers 324 and 328 may be propagated to memory array 310 when the polarity of the clock signal is 0). In this scenario, memory block 300 operates in double data rate mode.

As an alternative example, when both memory elements 352 and 354 are configured with the same value (e.g., logic "0"). In this scenario, multiplexer 350 may output the same value (e.g., logic "0") at all times independent of the logic level of the clock signal. A constant select signal received by multiplexers 332 and 334 has the effect that multiplexers 332 and 334 always select the same input for propagation to memory array 310 (e.g., the signals coming from rising edge triggered registers 320 and 322 or the signals coming from falling edge triggered registers 324 and 328). In this scenario, memory block 300 operates in single data rate mode.

Memory block 300 may include a timing generator 340 to control write and read operations in memory array 310. Timing generator 340 may schedule read and write operations in memory array 310 relative to the clock signal received on the clock input. For example, timing generator 340 may schedule a write operation after a rising clock edge followed by a delayed read operation. In such a configuration, memory block 300 may perform a write-before-read operation if the read and write operations are both enabled and accessing the same memory element in memory array 310. In an alternative scenario, timing generator 340 may schedule a read operation after a rising clock edge followed by a delayed write operation. In the alternative scenario, memory block 300 may perform a read-before-write operation if the read and write operations are both enabled and accessing the same memory element in memory array 310. Alternatively, timing generator 340 may execute the write and read operations simultaneously either immediately after a clock edge or delayed by a given time delay.

A memory element may be coupled to timing generator 340 and configure the timing generator to operate in single data rate mode or in double data rate mode.

Configurable register 360 and falling edge triggered register 370 may receive data signals from memory array 310 when performing read operations. Configurable register 360 may implement various different register configurations based on user input. For example, configurable register 360 may implement a double edge triggered register (i.e., a register that stores the value of received signals on a rising edge and on a falling edge of the clock signal), a rising edge triggered register, a falling edge triggered register, or a latch followed by a register, to name a few.

As one example, the configurable register 360 may be configured as a rising edge triggered register, when configurable register 360 provides data at output port 382 at the rising clock edge and register 370 provides data at output port 388 at the falling clock edge. In this example, memory block 300 may perform either a double data rate read operation using two output ports (e.g., output ports 382 and 388) or a single data rate read operation using one output port (e.g., one of output ports 382 or 388. In an alternative example, the configurable register 360 is configured as a double edge triggered register, when configurable register 360 provides data at output port 382 at the rising and falling clock edge, i.e. memory block 300 performs a double data rate read operation using one port.

In an alternative embodiment in which the read and write operations are accessing the same address in memory array 310, memory block 300 may be configured to perform a write operation on a rising clock edge and a read operation on a falling clock edge, thereby enabling ample timing margin to perform a write-before-read operation in single data rate mode (i.e., the read operation reads the new data that was just written to a given address). Alternatively, memory block 300 may be configured to perform a write operation on a falling clock edge and a read operation on a rising clock edge, thereby enabling ample timing margin to perform a read-before-write operation in single data rate mode (i.e., the read operation reads the old data at a given address before it is overridden by new data).

Figure 4:
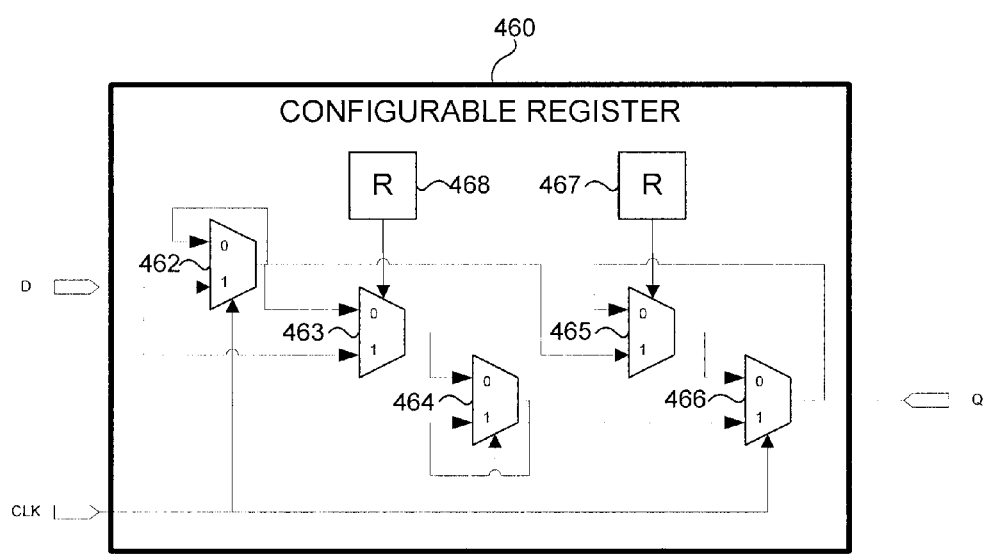
FIG. 4 is a diagram of an illustrative register that may be configured to implement different register types in accordance with an embodiment of the present invention.

FIG. 4 shows an diagram of an illustrative register circuit such as configurable register 460 in accordance with an embodiment of the invention. Configurable register 460 may have a data input, a data output, and a clock input. Configurable register 460 may have other inputs as well such as inputs for asynchronous and synchronous reset or preset signals, or inputs for enable signals.

Configurable register 460 may include five multiplexers 462 to 466 and two memory elements 467 and 468. The two memory elements 467 and 468 may control multiplexers 465 and 463 respectively. Multiplexer 463 may receive a signal from the output of multiplexer 462 and a signal from the data input of configurable register 460. Memory element 468 may select between the inputs of multiplexer 463. Multiplexer 465 may receive a signal from the output of multiplexer 462 and a signal from the output of multiplexer 466. Memory element 467 may select between the inputs of multiplexer 465. Memory elements 467 and 468 may be configured once during initialization. Configurable register 460 may also have two additional inputs (not shown) to configure memory elements 467 and 468 dynamically. Alternatively, multiplexers 463 and 465 may be coupled directly to those two additional inputs and thus external circuitry may select between the input signal of multiplexers 463 and 465.

Multiplexer 462 may receive a signal from the data input of configurable register 460 and another signal from the output of multiplexer 462. A clock signal received at the clock input may select between the input signal of multiplexer 462. In the configuration shown in FIG. 4, multiplexer 462 selects the data input signal for propagation when the clock signal is high. Thus, multiplexer 462 implements a transparent-high latch and any transparent-high latch may be used instead of multiplexer 462. For example, a D-latch may be used instead of multiplexer 462.

Multiplexer 464 may receive a signal from the output of multiplexer 463 and another signal from the output of multiplexer 464. A clock signal received at the clock input may select between the inputs of multiplexer 464. In the configuration shown in FIG. 4, multiplexer 464 selects the signal received from multiplexer 463 for propagation when the clock signal is low. Thus, multiplexer 464 implements a transparent-low latch and any transparent-low latch may be used instead of multiplexer 462. For example, a D-latch with an inverter on the clock input may be used instead of multiplexer 464.

Multiplexer 466 may receive a signal from the output of multiplexer 464 and another signal from the output of multiplexer 465 and select between the two signals based on the clock signal.

Configurable register 460 may implement four different register functions depending on the configuration of memory elements 467 and 468. The different configurations of configurable register 460 are shown as configurable registers 560A, 560B, 560C, and 560D in FIGS. 5A to 5D, respectively.

Figure 5A:
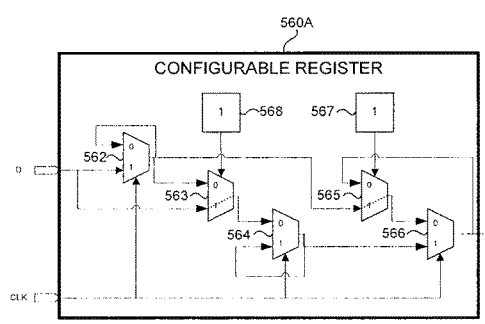
FIG. 5A is a diagram of the illustrative register of FIG. 4, where the register is configured to operate as a double edge triggered register in accordance with an embodiment of the present invention.

FIG. 5A shows configurable register 560A where memory elements 567 and 568 are both configured to be logic "1". In this scenario, multiplexer 564 receives the data signal from the data input and multiplexer 566 receives the signal from the output of multiplexer 562. At the rising clock edge, multiplexer 566 switches to select the signal from the output of multiplexer 564, i.e. the output of a transparent-low latch which is opaque when the clock is high. At the falling clock edge, multiplexer 566 switches to select the signal from the output of multiplexer 562, i.e. the output of a transparent-high latch which is opaque when the clock is low. Thus, configurable register 560 implements a double-edge triggered register when both memory elements 567 and 568 are configured to be logic "1."

Figure 5B:
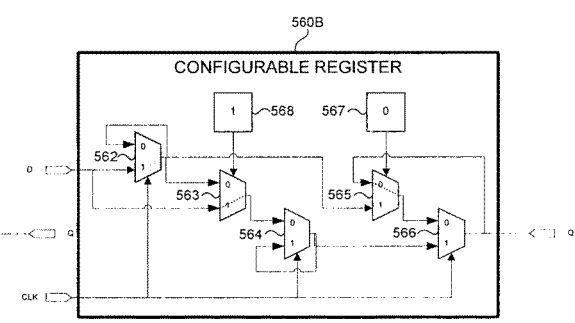
FIG. 5B is a diagram of the illustrative register of FIG. 4, where the register is configured to operate as a rising edge triggered register in accordance with an embodiment of the present invention.

FIG. 5B shows configurable register 560B where memory element 567 is configured to be logic "0" and memory element 568 is configured to be logic "1." In this scenario, multiplexer 564 receives the data signal from the data input and multiplexer 566 implements a transparent-high latch. At the rising clock edge, multiplexer 566 switches to select the signal from the output of multiplexer 564, i.e. the output of a transparent-low latch which is opaque when the clock is high. At the falling clock edge, multiplexer 566 keeps the same value. Thus, configurable register 560 implements a rising-edge triggered register when memory elements 567 is configured to be logic "0" and memory element 568 is configured to be logic "1."

Figure 5C:
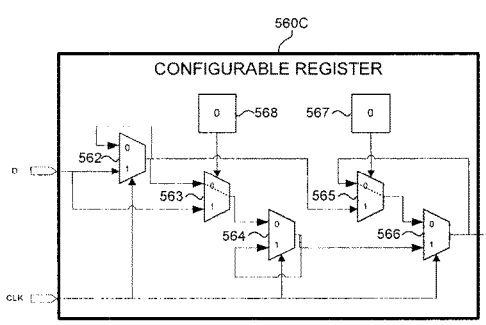
FIG. 5C is a diagram of the illustrative register of FIG. 4, where the register is configured to operate as a transparent-high latch coupled to a rising edge triggered register in accordance with an embodiment of the present invention.

FIG. 5C shows configurable register 560C where memory elements 567 and 568 are both configured to be logic "0." In this scenario, multiplexer 564 receives the signal from the output of multiplexer 562 and multiplexer 566 implements a transparent-high latch. At the rising clock edge, multiplexer 566 switches to select the signal from the output of multiplexer 564, i.e. the output of a transparent-low latch which is opaque when the clock is high. At the falling clock edge, multiplexer 566 switches to select the signal from the output of multiplexer 562, i.e. the output of a transparent-high latch which is opaque when the clock is low. Thus, configurable register 560 implements a transparent-high latch in series with a rising-edge triggered register when both memory elements 567 and 568 are configured to be logic "0."

Figure 5D:
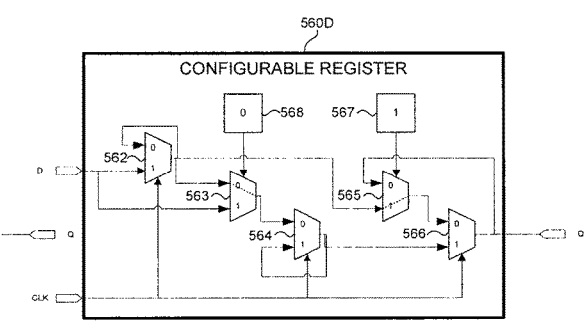
FIG. 5D is a diagram of the illustrative register of FIG. 4, where the register is configured to operate as a falling edge triggered register in accordance with an embodiment of the present invention.

FIG. 5D shows configurable register 560D where memory element 567 is configured to be logic "1" and memory element 568 is configured to be logic "0." In this scenario, multiplexer 564 receives the signal from the output of multiplexer 562 and multiplexer 566 receives the signal from the output of multiplexer 562. At the rising clock edge, multiplexer 566 switches to select the signal from the output of multiplexer 564 which, together with multiplexer 562, implements a falling-edge triggered register. At the falling clock edge, multiplexer 566 switches to select the signal from the output of multiplexer 562, i.e. the output of a transparent-high latch which is opaque when the clock is low. Thus, configurable register 560 implements a falling-edge triggered register when memory element 567 is configured to be logic "1" and memory element 568 is configured to be logic "0."

The embodiments of the configurable register shown in FIGS. 4, 5A, 5B, 5C, and 5D are merely illustrative and not intended to limit the scope of the invention. If desired, either one or both of multiplexers 463 and 465 may have their respective inputs swapped. As a consequence of both multiplexers 463 and 465 having their inputs swapped, configurable register 460 may implement a double-edge triggered register with memory elements 467 and 468 configured to be logic "0." Similarly, configurable register 460 may implement a rising-edge (falling-edge) triggered register with memory element 467 configured to be logic "1" (logic "0") and memory element 468 configured to be logic "0" (logic "1"), and configurable register 460 may implement a transparent-high latch in series with a rising-edge triggered register when both memory elements 467 and 468 are configured to be logic "1." In an alternative embodiment, the clock signal may be inverted and the inputs to multiplexers 462, 464, and 466 swapped.

Figure 6:
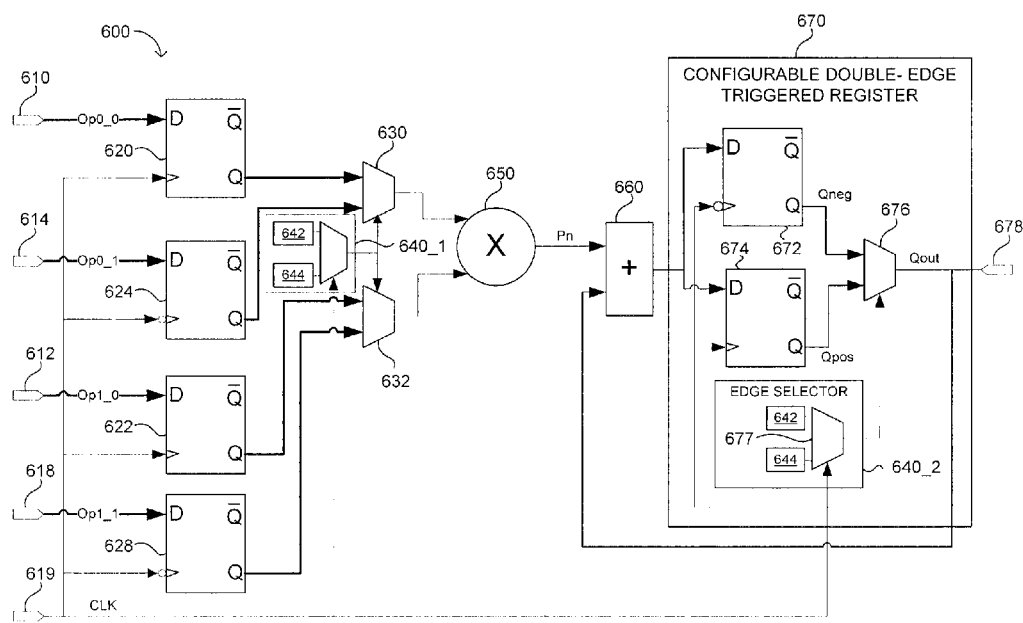
FIG. 6 is a diagram of an illustrative specialized processing block that may be configured to operate at single or double data rate in accordance with an embodiment of the present invention.

FIG. 6 shows a specialized processing block 600 that may be configured to operate at single data rate or double data rate in accordance with one embodiment. Specialized processing block 600 may include operand ports 610, 612, 614, and 618 for receiving operand signals from other blocks, and a clock port 619 for receiving a clock signal. Specialized processing block 600 may further include input registers 620, 622, 624, and 628, multiplier stage 650, adder stage 660, and configurable double-edge triggered register 670.

Specialized processing block 600 described in FIG. 6 is merely illustrate. In certain embodiments, specialized processing block 600 may have any desired number of operand ports, where each operand port has an arbitrary width enabling the respective port to receive a given number of signals simultaneously. Specialized processing block 600 may further be controlled by more than one clock signal. For example, each port may be controlled by a different clock signal. Alternatively, each given subset of the ports may be controlled by a different clock signal. Specialized processing block 600 may also have ports to receive additional control signals such as clock enable signals, reset signals, etc. Specialized processing block 600 may also generate additional output signals, for example signals that bypass remaining processing stages. Specialized processing block 600 may also have additional circuitry such as multiplexers and interconnection circuitry to provide for additional configuration options, coefficient storage that enable efficient processing of FIR filter implementations, pre-adder stages, shifter circuitry, just to name a few.

Each operand port of specialized processing block 600 may have two operand inputs for receiving operand signals from other blocks. The first operand inputs 610 and 612 may be coupled to registers 620 and 622, whereas the second operand inputs 614 and 618 may be coupled to registers 624 and 628. Registers 620, 622, 624, and 628 may be controlled by the clock signal. Registers 620 and 622 may be rising edge triggered registers, whereas registers 624 and 628 may be falling edge triggered registers. In other words, registers 620 and 622 store the value of the signals received via the coupled inputs on a rising edge of the clock signal, and registers 624 and 628 store the value of the signals received via the coupled inputs on a falling edge of the clock signal.

Specialized processing block 600 may include multiplexers 630 and 632. Multiplexer 630 may select between the operand signal stored in rising edge triggered operand register 620 and the operand signal stored in falling edge triggered operand register 624. Multiplexer 632 may select between the operand signal stored in rising edge triggered data register 622 and the data signal stored in falling edge triggered data register 628. Multiplexers 630 and 632 may select which of the respective inputs to propagate based on the clock signal received at the clock input (not shown).

Alternatively, multiplexers 630 and 632 may select which of the respective inputs to propagate based on the output of edge selector circuitry 640_1. Edge selector circuitry 640 (i.e., edge selector circuitry 640_1 and 640_2) may include two configuration memory elements 642 and 644 and a multiplexer. The multiplexer may receive two constant signals from memory elements 642 and 644. Memory elements 642 and 644 may be configured to a predetermined value. Typically, this is done once at initialization. However, in alternative embodiments, memory elements 642 and 644 may also be reconfigured while the specialized processing block 600 is operating. The clock signal may select which of the constant signals received by the multiplexer is propagated to the output of edge selector circuitry 640_1.

Consider the scenario in which both memory elements are configured with opposite values (e.g., the first memory element is configured to be logic "0" and the second memory element is configured to be logic "1"). In this scenario, the signal on the output of edge selector circuitry 640 may change polarity every time the polarity of the clock signal changes. A select signal received by multiplexers 630 and 632 that changes polarity every time the polarity of the clock signal changes has the effect that multiplexers 630 and 632 always select a different input for propagation to multiplier stage 650 based on the polarity of the clock signal (e.g., the signals coming from rising edge triggered registers 620 and 622 may be propagated to multiplier stage 650 when the polarity of the clock signal is 1, and the signals coming from falling edge triggered registers 624 and 628 may be propagated to multiplier stage 650 when the polarity of the clock signal is 0). In this scenario, specialized processing block 600 operates in double data rate mode.

As another example, consider the scenario in which both memory elements 642 and 644 are configured with the same value (e.g., logic "0"). In this scenario, edge selector circuitry 640 may output the same value (e.g., logic "0") at all times independent of the logic level of the clock signal. A constant select signal received by multiplexers 630 and 632 has the effect that multiplexers 630 and 632 always select the same input for propagation to multiplier stage 650 (e.g., the signals coming from rising edge triggered registers 620 and 622 or the signals coming from falling edge triggered registers 624 and 628). In this scenario, specialized processing block 600 operates in single data rate mode.

The outputs of multiplexers 630 and 632 may be coupled to multiplier stage 650. Multiplier stage 650 may receive the selected operands from multiplexers 630 and 632 and compute the product of the received operands. The product may be added to products computed by other multipliers (not shown) using adder stage 660. Alternatively, the product may be provided directly to the output of the specialized processing block 600 or the product may be accumulated by adder stage 660 together with configurable double edge register 670 as shown in FIG. 6.

Configurable double-edge triggered register 670 may include edge selector circuitry 640_2, rising edge triggered register 674, falling edge triggered register 672, and multiplexer 676. Multiplexer 676 may receive signals from registers 672 and 674 and select which of the respective inputs to propagate based on the output of edge selector circuitry 640_2. Edge selector circuitry 640_2 may include two memory elements and multiplexer 677. The multiplexer may receive two constant signals from the two memory elements. These memory elements may be configured once at initialization. The memory elements may also be reconfigured while the specialized processing block 600 is operating. The clock signal may select which of the constant signals received by the multiplexer is propagated to the output of edge selector circuitry 640_2.

For example, both memory elements may be configured with the same value (e.g., logic "0"). In this scenario, edge selector circuitry 640 may output the same value (e.g., logic "0") at all times independent of the polarity of the clock signal. A constant select signal received by multiplexer 676 has the effect that multiplexer 676 always selects the same input for propagation. In this scenario, specialized processing block 600 may operate in single data rate mode.

In an alternative example, both memory elements may be configured with opposite value (e.g., the first memory element is configured to be logic "0" and the second memory element is configured to be logic "1"). In this example, the signal on the output of edge selector circuitry 640 may change polarity every time the polarity of the clock signal changes. A select signal received by multiplexer 676 that changes polarity every time the polarity of the clock signal changes has the effect that multiplexer 676 always selects a different input based on the polarity of the clock signal. In this scenario, specialized processing block 600 operates in double data rate mode.

Figure 7:
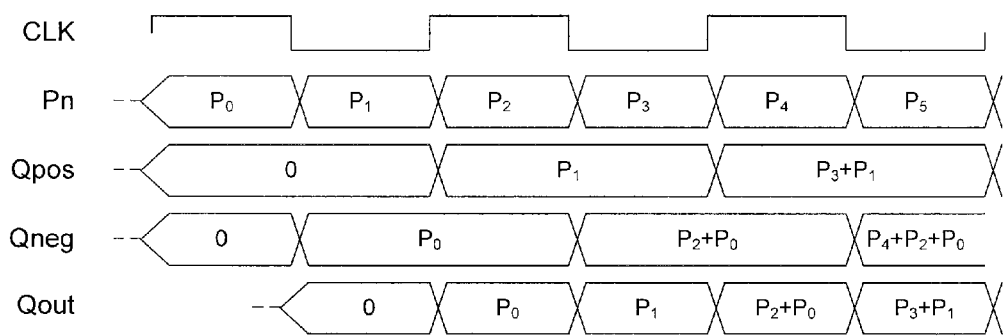
FIG. 7 is a waveform diagram showing an example for using the configurable processing block of FIG. 6 to perform a first accumulation on the rising clock edge and a second accumulation on the falling clock edge in accordance with an embodiment of the present invention.
Figure 8:
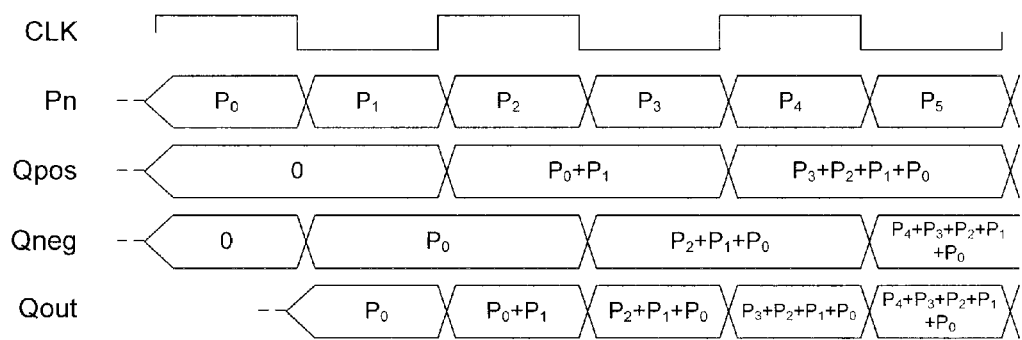
FIG. 8 is a waveform diagram showing an example for using the configurable processing block of FIG. 6 to perform an accumulation on the rising and falling clock edges in accordance with an embodiment of the present invention.

Configurable edge triggered register 670 and adder stage 660 may serve as an accumulator. When specialized processing block 600 operates in single data rate mode, the accumulator may add signals at either the rising or falling clock edge depending on the current state of edge selector 640. In double data rate mode, specialized processing block 600 may either perform one accumulation at twice the clock rate or two different accumulations at the clock rate. FIGS. 7 and 8 illustrate the accumulations in double data rate mode.

FIG. 7 shows a waveform diagram illustrating the configuration of adder stage 660 and configurable double-edge triggered register 670 for performing two accumulations, a first accumulation on the rising clock edge and a second accumulation on the falling clock edge. At each rising and falling clock edge, adder stage 660 receives signal Pn from the multiplier stage 650 and signal Qout from configurable double-edge triggered register 670. Adder stage 660 computes the sum of the signals Pn and Qout and writes the result to registers 672 and 674 where the result is stored at the falling and rising clock edge respectively. For example, register 672 stores signal P0 at the first falling clock edge as illustrated by signal Qneg. At the next rising clock edge, register 674 stores signal P1 as illustrated by signal Qpos. For example, edge selector 640 may be configured to select signal Qneg when the clock signal is logic "1" and signal Qpos when clock signal is logic "0." In this example, adder stage 660 receives signals P0 and P2 at the second falling clock edge and stores the sum P2+P0 in register 672. At the next rising clock edge, adder stage 660 receives signals P3 and P1 and stores the sum P3+P1 in register 674. Thus, two different accumulations are performed, a first accumulation at the rising clock edge and a second accumulation at the falling clock edge.

FIG. 8 is a waveform diagram illustrating the configuration of adder stage 660 and configurable double-edge triggered register 670 for performing one accumulation at twice the clock rate. At each rising and falling clock edge, adder stage 660 receives signal Pn from the multiplier stage 650 and signal Qout from configurable double-edge triggered register 670. Adder stage 660 computes the sum of the signals Pn and Qout and writes the result to registers 672 and 674 where the result is stored at the falling and rising clock edge respectively. For example, register 672 stores signal P0 at the first falling clock edge as illustrated by signal Qneg. For example, edge selector 640 may be configured to select signal Qneg when the clock signal is logic "0" and signal Qpos when clock signal is logic "1." In this example, adder stage 660 receives signals P0 and P1 at the first rising clock edge and stores the sum P0+P1 in register 674. At the next falling clock edge, adder stage 560 receives signal P2 from multiplier stage 650 and signal P0+P1 from configurable double-edge triggered register 670 and stores the sum P2+P1+P0 in register 672. Thus, one accumulation is performed at twice the clock rate.

Figure 9:
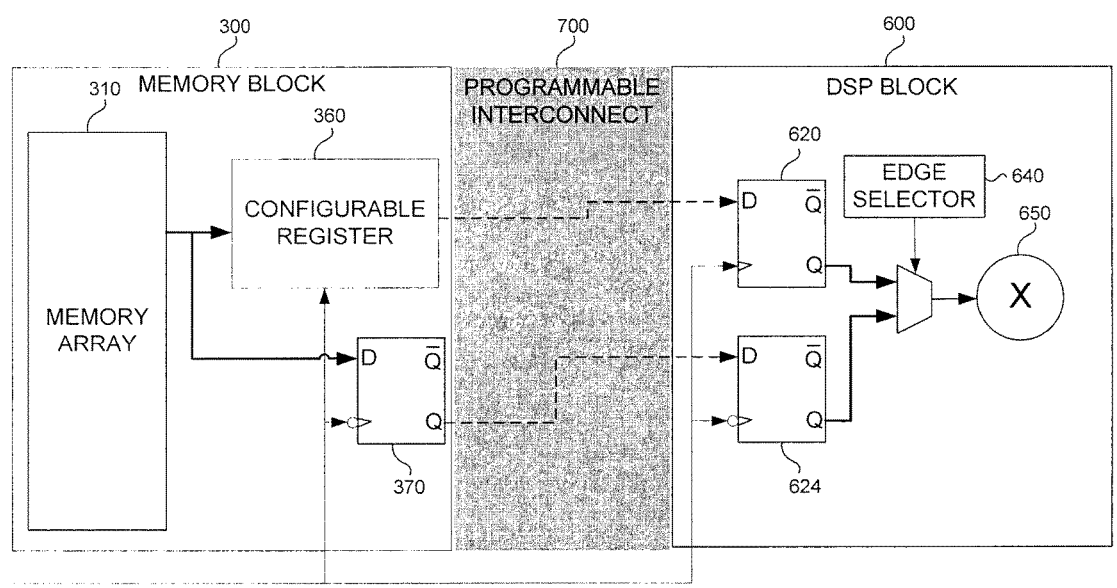
FIG. 9 is a diagram of a configurable storage block that is coupled to a configurable processing block using two interconnections when operating at double data rate in accordance with an embodiment of the present invention.
Figure 10:
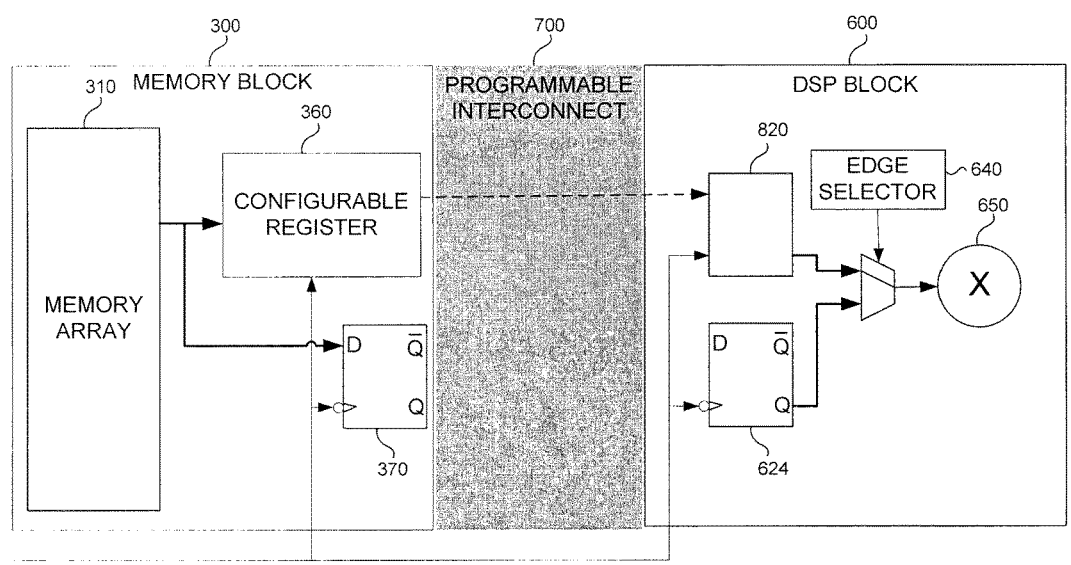
FIG. 10 is a diagram of a configurable storage block that is coupled to a configurable processing block using one interconnection when operating at double data rate in accordance with an embodiment of the present invention.
Figure 11:
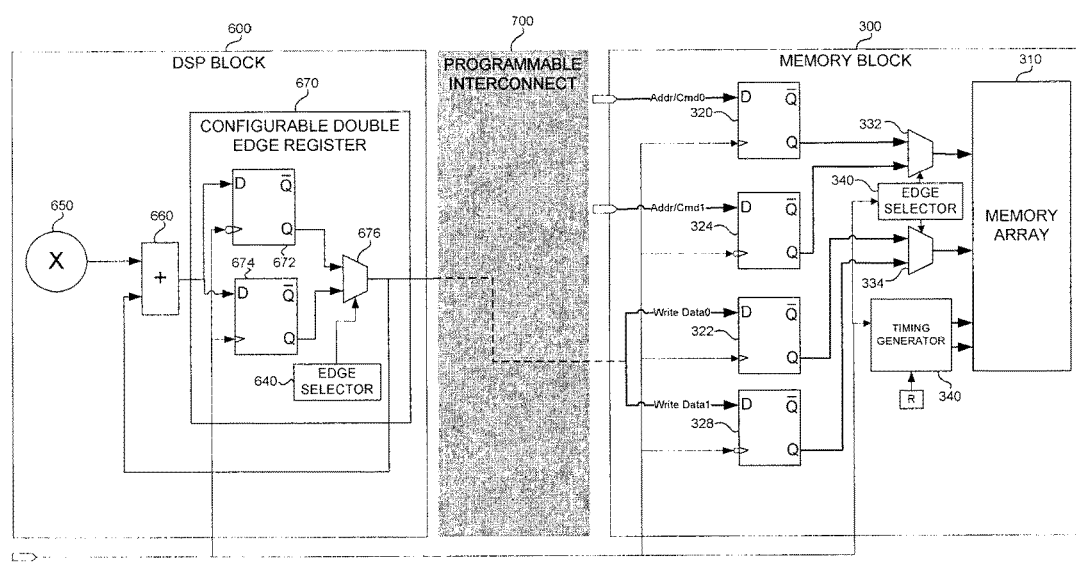
FIG. 11 is a diagram of a configurable processing block that is coupled to a configurable storage block using one interconnection when operating at double data rate in accordance with an embodiment of the present invention.

The embodiments of the memory block and specialized processing block described herein can be coupled together to implement FIR filters. FIGS. 9, 10, and 11 illustrate embodiments, in which memory block 300 and specialized processing block 600 are coupled using programmable interconnect 700, and where both blocks are configured to operate in double data rate mode. For example, as illustrated in FIG. 9, a first signal may be sent from configurable register 360 in memory block 300 to rising edge triggered register 620 in specialized processing block 600 at the rising clock edge using interconnection resources in programmable interconnect 700. A second signal may be sent from falling edge triggered register 370 in memory block 300 over separate interconnection resources in programmable interconnect 700 to the falling edge triggered register 624 in specialized processing block 600.

FIG. 10 illustrates an alternative embodiment, where memory block 300 may send a new signal at every rising and falling clock edge using configurable register 360 with the appropriate setting as shown above over interconnection resources in programmable interconnect 700 to double edge triggered register 820 in specialized processing block 600. The configuration of FIG. 10 uses less interconnection resources than the configuration of FIG. 9. However, the interconnections resources are operated at double data rate (i.e., at both, the rising and falling edges of the clock).

Alternative embodiments may couple a specialized processing block 600 to a memory block 300, for example to store the result of an arithmetic operation for further processing. Such an embodiment is shown in FIG. 11. In this configuration, configurable double edge triggered register 670 may send signals over interconnection resource of programmable interconnect 700 to rising edge triggered register 322 and falling edge triggered register 328 in memory block 300. Specialized processing block 600 and memory block 300 may be configured in single data rate mode or in double data rate mode.

The method and apparatus described herein may be incorporated into any suitable electronic device or system of electronic devices. For example, the method and apparatus may be incorporated into numerous types of devices such as microprocessors or other integrated circuits (ICs). Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for operating a specialized processing block that is controlled by a clock signal, the method comprising:
   with an adder stage, receiving first and second signals from a multiplier stage, wherein the multiplier stage generates the first signal during a first phase of a given clock cycle of the clock signal and the second signal during a second phase of the given clock cycle;
   with the adder stage, receiving a third signal from a positive-edge-triggered register during the given clock cycle;

with the adder stage, receiving a fourth signal from a negative-edge-triggered register that is separate from the positive-edge-triggered register during the given clock cycle.

2. The method of claim 1 further comprising:
with the adder stage, generating a first sum based on the first and third signals received at the adder stage; and
storing the first sum in the positive-edge-triggered register.

3. The method of claim 2 further comprising:
with the adder stage, generating a second sum based on the second and fourth signals received at the adder stage; and
storing the second sum in the negative-edge-triggered register.

4. The method of claim 3, wherein the specialized processing block further comprises a multiplexer, the method further comprising:
receiving the first sum from the positive-edge-triggered register and the second sum from the negative-edge-triggered register with the multiplexer;
selecting between the first and second sums based on the clock signal with the multiplexer; and
routing the selected sum to an output of the specialized processing block and to the adder stage with the multiplexer.

5. The method of claim 4, wherein selecting between the first and second sums comprises:
selecting the first sum when the clock signal has a first value; and
selecting the second sum when the clock signal has a second value that is different than the first value.

6. The method of claim 4, wherein the specialized processing block further comprises an additional multiplexer and wherein selecting between the first and second sums comprises:
with the additional multiplexer, receiving a first constant signal having a first polarity and a second constant signal having a second polarity that is different than the first polarity; and
with the additional multiplexer, selecting between the first constant signal and the second constant signal based on the clock signal.

7. The method of claim 6, wherein the first and second constant signals are produced by programmable circuitry operable to adjust the first polarity of the first constant signal and the second polarity of the second constant signal.

8. A register circuit, comprising:
a clock input that receives a clock signal;
a register input;
a register output;
a memory element storing a bit;
a first latch having a data input, a clock input, and an output, wherein the data input of the first latch receives a data input signal from the register input, and wherein the first latch is controlled by the clock signal;
a first multiplexer having a first input, a second input, and an output, wherein the first input of the first multiplexer receives the data input signal from the register input, wherein the second input of the first multiplexer is coupled to the output of the first latch, and wherein the first multiplexer is controlled by the bit stored in the memory element;
a second latch having a data input, a clock input, and an output, wherein the data input of the second latch is coupled to the output of the first multiplexer, wherein the output of the second latch is coupled to the register output, and wherein the second latch is controlled by the clock signal; and
a second multiplexer having a first input, a second input, and an output, wherein the first input of the second multiplexer is coupled to the output of the second latch, wherein the second input of the second multiplexer is coupled to the output of the first latch, wherein the output of the second multiplexer is coupled to the register output, and wherein the second multiplexer is controlled by the clock signal.

9. The register circuit of claim 8, further comprising:
a third latch having a data input, a clock input, and an output, wherein the data input of the third latch is coupled to the output of the second latch, wherein the output of the third latch is coupled to the register output, and wherein the third latch is controlled by the clock signal.

10. The register circuit of claim 8, further comprising:
an additional memory element storing an additional bit; and
a third multiplexer having a first input, a second input, and an output, wherein the output of the second multiplexer is also coupled to the first input of the third multiplexer, wherein the second input of the third multiplexer is coupled to the output of the first latch, and wherein the third multiplexer is controlled by the additional bit that is stored in the additional memory element.

11. The register circuit of claim 8, wherein the first latch comprises a transparent-high latch, and wherein the second latch comprises a transparent-low latch.

12. An integrated circuit, comprising:
a data rate selector circuit;
a multiplier stage that receives signals from the data rate selector circuit; and
a configurable register that receives signals from the multiplier stage and that comprises:
a positive-edge-triggered register;
a negative-edge-triggered register; and
a multiplexer that receives signals from the positive-edge-triggered and negative-edge-triggered registers.

13. The integrated circuit of claim 12, wherein the data rate selector circuit includes a first edge selector circuit.

14. The integrated circuit of claim 13, wherein the configurable register includes a second edge selector circuit.

15. The integrated circuit of claim 12, further comprising:
an adder stage that is interposed between the multiplier stage and the configurable register.

16. The integrated circuit of claim 15, wherein the adder stage has an input that is connected to an output of the configurable register.

17. The integrated circuit of claim 12, wherein the configurable register further comprises:
an edge selector circuit that controls the multiplexer.

* * * * *